(12) United States Patent
Chang

(10) Patent No.: US 7,952,111 B2
(45) Date of Patent: May 31, 2011

(54) LED AND METHOD FOR MAKING THE SAME

(75) Inventor: Chia-Shou Chang, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 178 days.

(21) Appl. No.: 12/468,856

(22) Filed: May 19, 2009

(65) Prior Publication Data

US 2010/0051989 A1    Mar. 4, 2010

(30) Foreign Application Priority Data

Aug. 26, 2008    (CN) .......................... 2008 1 0304205

(51) Int. Cl.
*H01L 33/00* (2010.01)

(52) U.S. Cl. .................. 257/98; 257/100; 257/E33.059; 257/E33.061; 257/E33.068

(58) Field of Classification Search .................... 257/81, 257/82, 91, 98, 99, 100, 116, 117, 432–437, 257/749, E33.056–E33.059, E25.032
See application file for complete search history.

(56) References Cited

U.S. PATENT DOCUMENTS

| 2005/0035365 A1* | 2/2005 | Sato et al. ..................... 257/100 |
| 2008/0152933 A1* | 6/2008 | Mizuno et al. ................ 428/480 |
| 2008/0210965 A1* | 9/2008 | Hung .............................. 257/98 |
| 2009/0256166 A1* | 10/2009 | Koike et al. .................... 257/98 |

FOREIGN PATENT DOCUMENTS

JP          2005197317 A        7/2005

* cited by examiner

*Primary Examiner* — N Drew Richards
*Assistant Examiner* — Mamadou Diallo
(74) *Attorney, Agent, or Firm* — Frank R. Niranjan

(57) ABSTRACT

An LED includes a substrate, an LED die, and a packaging layer. The substrate has conductive pins extending therethrough. The LED die is arranged on the substrate and electronically connected to the conductive pins of the substrate. The packaging layer fills in the substrate to encapsulate the LED die therein. A plurality of fillers are distributed in the packaging layer. Each of the fillers has a plurality of nanoparticles distributed therein for enhancing a light dispersion of light generated by the LED die.

13 Claims, 2 Drawing Sheets

LED AND METHOD FOR MAKING THE SAME

BACKGROUND

1. Technical Field

The disclosure generally relates to LEDs, and particularly to an LED with improved light distribution and a method for making the LED.

2. Description of Related Art

In recent years, LEDs are preferred for use in illumination devices rather than conventional lighting devices, such as bulbs, and CCFLs (cold cathode fluorescent lamps), due to their excellent properties, including high brightness, long lifespan, wide color range, etc. However, the LED is a point light source, and has a beam angle usually less than 120 degrees, which is much smaller than that of conventional lighting devices. In addition, an intensity of a light field of the LED is uneven, being strong at a center of the light field of the LED and weak at the periphery.

For the foregoing reasons, therefore, there is a need in the art for an LED which overcomes the limitations described.

DETAILED DESCRIPTION

Figure 1:
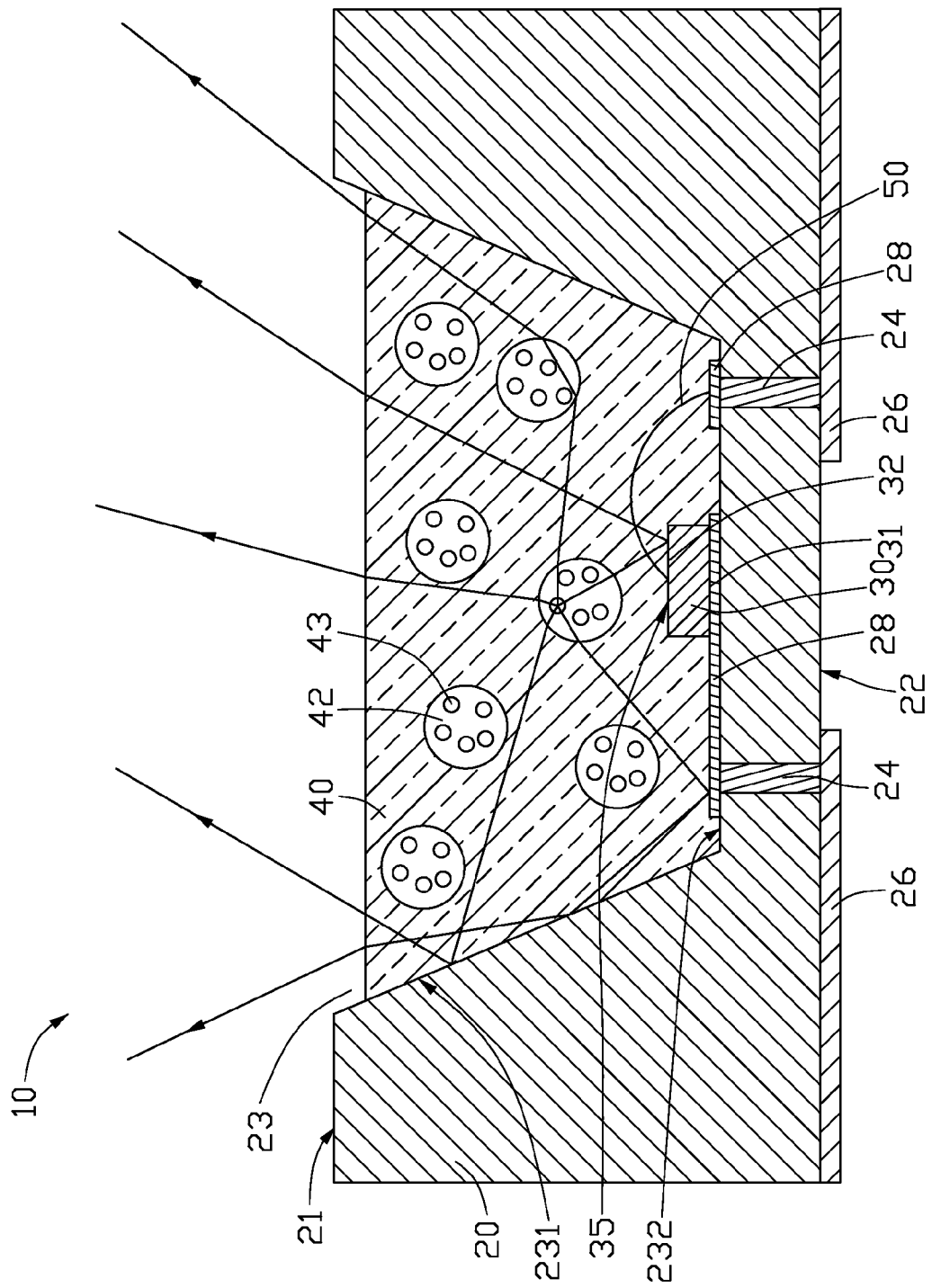
FIG. 1 is a cross sectional view of an LED according to an exemplary embodiment.

Referring to FIG. 1, an LED 10 according to an exemplary embodiment includes a substrate 20, an LED die 30 for generating light, and a packaging layer 40 encapsulating the LED die 30.

The substrate 20 is substantially cup-shaped. A blind hole 23 is concaved downwards into the substrate 20 from a top surface 21 of the substrate 20. A depth of the blind hole 23 is smaller than a height of the substrate 20, and thus does not extend through the substrate 20. The blind hole 23 is substantially inverted truncated conical, and has a cross section decreasing gradually along a downward direction. A central axis of the blind hole 23 is coincident with that of the substrate 20. A mounting surface 232 is formed in the substrate 20 at a bottom of the blind hole 23 adjacent to a bottom surface 22 of the substrate 20, and a reflecting surface 231 is formed in the substrate 20 surrounding the blind hole 23. The mounting surface 232 has a size much smaller than that of the bottom surface 22 of the substrate 20, and the reflecting surface 231 expands upwardly from the mounting surface 232.

The substrate 20 defines a pair of mounting holes spaced from each other. Each mounting hole extends vertically from the mounting surface 232 to the bottom surface 22 of the substrate 20, and receives one conductive pin 24 therein. A pair of outer terminals 26 are formed on the bottom surface 22 of the substrate 20 corresponding to the conductive pins 24, respectively. Each outer terminal 26 is located under and electrically connected to a bottom end of the corresponding conductive pin 24. The two outer terminals 26 are insulated and spaced from each other. Similarly, a pair of inner terminals 28 are formed on the mounting surface 232 of the substrate 20 corresponding to the conductive pins 24, respectively. Each inner terminal 28 is located over and electrically connected to a top end of the corresponding conductive pin 24. The two inner terminals 28 are insulated and spaced from each other. Thus each inner terminal 28 is connected to the corresponding outer terminal 26 electrically, and is insulated from the other inner terminal 28 and the other outer terminal 26.

The LED die 30 is arranged over the mounting surface 232 of the substrate 20, and coaxially located over a center of the mounting surface 232 of the substrate 20. The LED die 30 forms an emitting surface 35 at a top side thereof, and has a pair of electrodes 31, 32 respectively formed at top and bottom sides thereof for connecting with a power source. The LED die 30 is arranged on one inner terminal 28 (i.e., the left inner terminal 28 in FIG. 1) with one electrode 31 at the bottom side thereof connecting to the left inner terminal 28 of the substrate 20. The other electrode 32 of the LED die 30 at the top side thereof is electrically connected to the other inner terminal 28 (i.e., the right inner terminal 28 in FIG. 1) by a wire 50 through wire bonding. Thus the electrodes 31, 32 of the LED die 30 are respectively electrically connected to the outer terminals 26 through the inner terminals 28 and the conductive pins 24.

The packaging layer 40 is filled in the blind hole 23 to encapsulate the LED die 30 therein for protecting the LED die 30 from environmental harm or mechanical damage. The packaging layer 40 is made of transparent materials, such as acryl, silica gel or epoxy resin. The packaging layer 40 is substantially inverted truncated conical, and has a cross section increasing gradually along an upward direction.

A plurality of fillers 42 are substantially evenly distributed in the packaging layer 40 for enhancing a light dispersion. A melting point of the fillers 42 is higher than that of the packaging layer 40, and a light refractive index of the fillers 42 is larger than that of the packaging layer 40. Each filler 42 is round, and has an average diameter in micro-scale. A plurality of nano-particles 43 are distributed in each of the fillers 42 with an average size in range of 2~20 nn. The nano-particles 43 can be $Al_2O_3$, $SiOx$ or $TiOx$ (x is in range of 1~2).

During operation of the LED 10, the outer terminals 26 are electrically connected to the power source to cause the LED die 30 to emit light. The light of the LED die 30 travels upwardly with a beam angle of about 120 degrees. A part of the light pass across the packaging layer 40 between the fillers 42 directly to outside, and a part of the light which travels into the fillers 42 will be redirected. Since the light refractive index of the fillers 42 is larger than that of the packaging layer 40, a total reflection will not happen when the light travels through the packaging layer 40 and reaches the fillers 42. Oppositely, the light which travels to reach the fillers 42 must enter the fillers 42. The light enters the filler 42 will be dispersed into a plurality of light beams by the nano-particles 43 in the filler 42 to leave the filler 42. Directions of the light beams are random, with some of the light beams traveling to outside directly, other some of the light beams traveling to the reflecting surface 231, whose directions are redirected at the reflecting surface 231, and the other some of the light beams traveling to reach other fillers 42, at which the other some of the light beams are further dispersed. Thus the light of the LED die 30 after across the packaging layer 40 with the fillers 42 can be converted into an evenly distributed surface light. A light distribution of the LED is thus improved.

Figure 2:
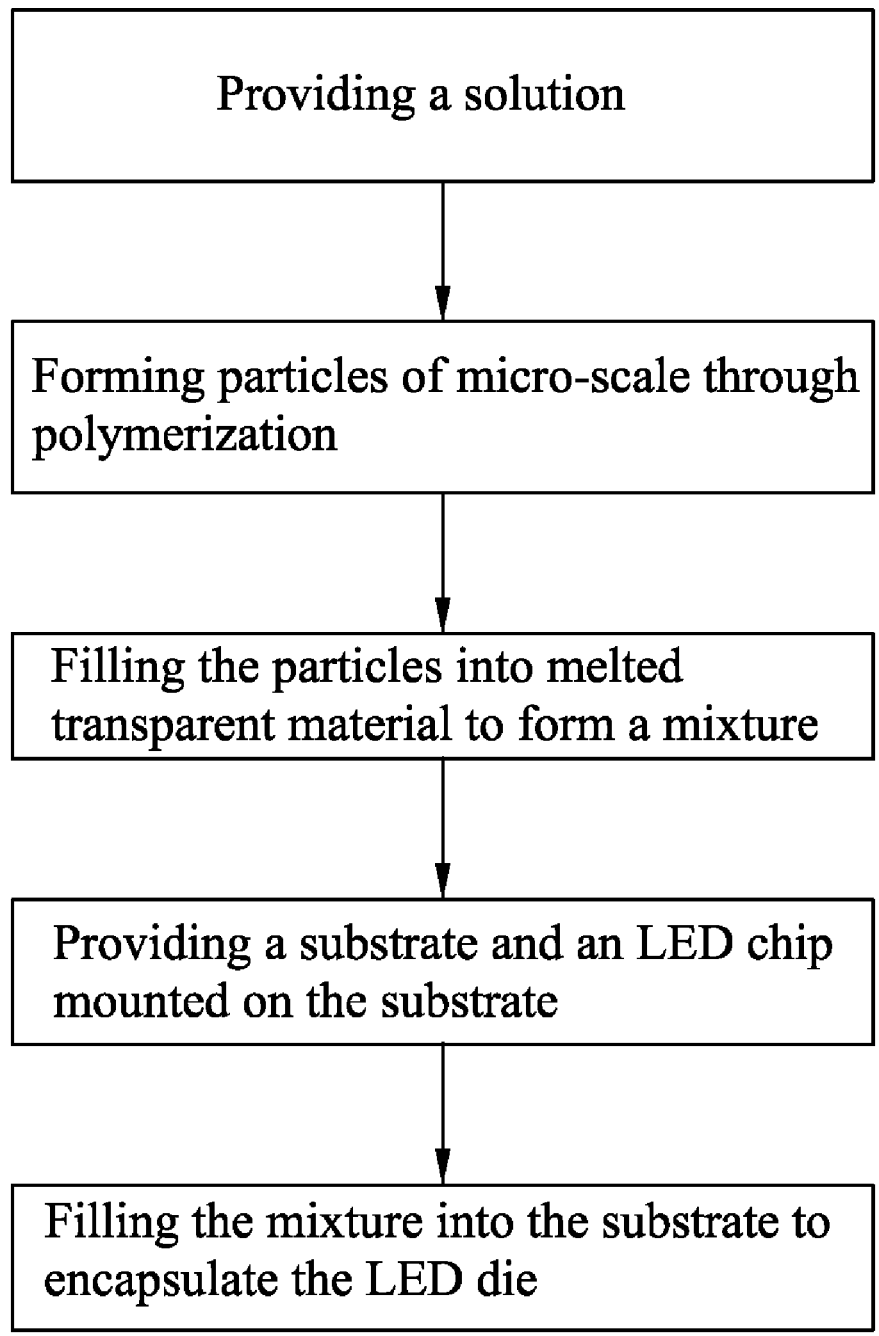
FIG. 2 is a flow chart of a method for making the LED of FIG. 1.

Referring to FIG. 2, a method for making such an LED 10 includes the following steps: a) providing a solution; b) forming particles of micro-scale through polymerization of the solution; c) filling the particles of micro-scale into molten transparent material to form a mixture; d) providing a substrate and an LED chip mounted on the substrate; and e) filling the mixture into the substrate to form a packaging layer encapsulating the LED die. Details are given below.

Forming particles of micro-scale through polymerization can be emulsion polymerization or suspension polymerization. For emulsion polymerization, the solution is formed by transparent material, nano-particles and solvent. The solvent is water with dissolved emulsification, such as dodecyl sodium sulfate ($C_{12}H_{25}OSO_3Na$). The transparent material is acryl, silica gel or epoxy resin, and is melted. The nano-particles are selected from $Al_2O_3$, SiOx or TiOx, and have an average diameter in range of 2-20 nm. The melted transparent material and the nano-particles are filled into the solvent to form the solution. Then the solution is heated to generate emulsion polymerization to form the particles of micro-scale. The particles of micro-scale each have a plurality of nano-particles distributed therein. A melting point of the particles of micro-scale is higher than that of the transparent material, and a light refractive index of the particles of micro-scale is larger than that of the transparent material.

Suspension polymerization is similar to emulsion polymerization, the difference is that a dispersant is adopted in suspension polymerization to substitute the emulsification in emulsion polymerization. The dispersant can be polyethylene glycol, polyvinyl or polyacrylic acid. The solvent is formed of water with dissolved dispersant. Accordingly, melted transparent material and nano-particles are filled into the solvent to form the solution, and then the solution is heated to generate suspension polymerization to form the particles of micro-scale.

Then the particles of micro-scale are filled into melted transparent material to form a mixture. Finally the mixture of the melted transparent material and the particles of micro-scale is filled into the blind hole 23 of the substrate 20. After the mixture is cooled, a packaging layer 40 is formed encapsulating the LED die 30 therein. Accordingly, the particles of micro-scale distributed in the mixture forms the fillers 42 of the packaging layer 40 to enhance a dispersion.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED, comprising:
    an LED die for emitting light; and
    a packaging layer encapsulating the LED die, the packaging layer comprising a plurality of fillers distributed therein, each of the fillers having a plurality of nano-particles distributed therein for enhancing a light dispersion of light generated by the LED die.

2. The LED of claim 1, wherein each of the fillers has an average diameter in micro-scale.

3. The LED of claim 2, wherein each of the nano-particles have an average size in range of 2~20 nm.

4. The LED of claim 3, wherein the nano-particles are selected from $Al_2O_3$, SiOx and TiOx, and x is in range of 1~2.

5. The LED of claim 1, wherein the fillers have a melting point higher than that of the packaging layer.

6. The LED of claim 1, wherein the fillers have a light refractive index larger than that of the packaging layer.

7. The LED of claim 1, wherein the packaging layer is one of acryl, silica gel and epoxy resin.

8. The LED of claim 1, further comprising a substrate defining a blind hole therein, the LED die being arranged on the substrate at a bottom of the blind hole, the packaging layer filled in the blind hole.

9. The LED of claim 8, wherein a pair of mounting holes are defined in the substrate receiving conductive pins therein, terminals being formed at and connected to opposite ends of each conductive pin, the LED die forming a pair of electrodes at opposite sides thereof, the electrodes electrically connecting with the conductive pins respectively.

10. A method for making an LED, comprising steps of:
    providing a solution of molten transparent material, nano-particles and solvent;
    forming particles of micro-scale through polymerization of the solution;
    providing melted transparent material and filling the particles of micro-scale into the melted transparent material to form a mixture;
    providing a substrate having a blind hole receiving an LED die therein;
    filling the mixture into the blond hole of the substrate to form a packaging layer encapsulating the LED die.

11. The method of claim 10, wherein the polymerization is emulsion polymerization, and the solvent is water with dissolved dodecyl sodium sulfate.

12. The method of claim 10, wherein the polymerization is suspension polymerization, and the solvent is water with dissolved dispersant.

13. The method of claim 12, wherein the dispersant is one of polyethylene glycol, polyvinyl and polyacrylic acid.

* * * * *